(12) United States Patent
Matsuoka et al.

(10) Patent No.: US 8,872,257 B1
(45) Date of Patent: Oct. 28, 2014

(54) SEMICONDUCTOR DEVICE

(71) Applicant: Kabushiki Kaisha Toshiba, Minato-ku (JP)

(72) Inventors: Takeru Matsuoka, Hyogo-ken (JP); Yasuhito Saito, Hyogo-ken (JP); Seiichiro Kamiyama, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,145

(22) Filed: Aug. 30, 2013

(30) Foreign Application Priority Data

May 21, 2013 (JP) .................................. 2013-107255

(51) Int. Cl.
*H01L 29/76* (2006.01)
*H01L 29/94* (2006.01)
*H01L 29/78* (2006.01)

(52) U.S. Cl.
CPC ........ *H01L 29/7815* (2013.01); *H01L 29/7813* (2013.01)
USPC ............................. 257/328; 257/330; 257/341

(58) Field of Classification Search
CPC ........................ H01L 29/7813; H01L 29/7815
USPC .................... 257/327–331, 340, 341
See application file for complete search history.

(56) References Cited

U.S. PATENT DOCUMENTS

| | | | | |
|---|---|---|---|---|
| 6,710,403 | B2 * | 3/2004 | Sapp | 257/330 |
| 6,713,352 | B2 * | 3/2004 | Hshieh et al. | 438/270 |
| 7,180,106 | B2 | 2/2007 | Hatade et al. | |
| 8,564,052 | B2 * | 10/2013 | Hsieh | 257/330 |
| 2012/0061723 | A1 | 3/2012 | Ishii | |

FOREIGN PATENT DOCUMENTS

| | | |
|---|---|---|
| JP | 2009-146994 A | 7/2009 |
| JP | 2011-097116 A | 5/2011 |
| JP | 2012-182241 A | 9/2012 |

* cited by examiner

*Primary Examiner* — Hung Vu
(74) *Attorney, Agent, or Firm* — White & Case LLP (57) ABSTRACT

According to one embodiment, a semiconductor device includes: a first region including: a first semiconductor layer; a first semiconductor region; a second semiconductor region; a third semiconductor region having higher impurity concentration than the first semiconductor region; a first electrode; a second electrode; an insulating film; a third electrode; a fourth electrode, a second region including a pad electrode, and the third region including: the first semiconductor layer; the first semiconductor region; a third semiconductor region; the first electrode; the second electrode; and a first insulating layer.

15 Claims, 9 Drawing Sheets

SEMICONDUCTOR DEVICE

CROSS-REFERENCE TO RELATED APPLICATIONS

This application is based upon and claims the benefit of priority from Japanese Patent Application No. 2013-107255, filed on May 21, 2013; the entire contents of which are incorporated herein by reference.

FIELD

Embodiments described herein relate generally to a semiconductor device.

BACKGROUND

Recently, demand for power MOSFETs has been growing, for instance, in applications for driving vehicle-mounted motors such as in EPS (electrically-assisted power steering). The motor can be driven by e.g. a three-phase inverter and an H-bridge circuit. In a power MOSFET, a recovery current flows because of the presence of energization of the parasitic diode and reverse recovery operation. When this recovery current flows, a prescribed breakdown voltage is required to avoid destruction of the semiconductor by this current (in the following, this tolerance is referred to as trr withstand capability). This also applies to the low-side MOSFET of a synchronous rectification DC-DC converter.

In this context, a trench gate MOSFET having a field plate structure has been drawing attention. In such elements, higher trr withstand capability is required.

DETAILED DESCRIPTION

In general, according to one embodiment, a semiconductor device includes: a first region; a second region; and a third region provided between the first region and the second region, the first region including: a first semiconductor layer of a first conductivity type; a first semiconductor region of a second conductivity type provided on the first semiconductor layer; a second semiconductor region of the first conductivity type provided on the first semiconductor region; a third semiconductor region of the second conductivity type being in contact with the first semiconductor region, and the third semiconductor region having higher impurity concentration than the first semiconductor region; a first electrode electrically connected to the second semiconductor region and the third semiconductor region; a second electrode electrically connected to the first semiconductor layer; an insulating film extending from a surface of the first semiconductor region into the first semiconductor layer; a third electrode in contact with the first semiconductor region via the insulating film; a fourth electrode in contact with the first semiconductor layer and the third electrode via the insulating film, the second region including a pad electrode electrically connected to the third electrode above the first semiconductor layer, and the third region including: the first semiconductor layer; the first semiconductor region provided on the first semiconductor layer; the third semiconductor region in contact with the first semiconductor region; the first electrode electrically connected to the third semiconductor region; the second electrode electrically connected to the first semiconductor layer; and a first insulating layer extending from a position of the third semiconductor region to a position of the first semiconductor layer.

Embodiments will now be described with reference to the drawings. In the following description, like members are labeled with like reference numerals, and the description of the members once described is omitted appropriately.

(First Embodiment)

Figure 1A:
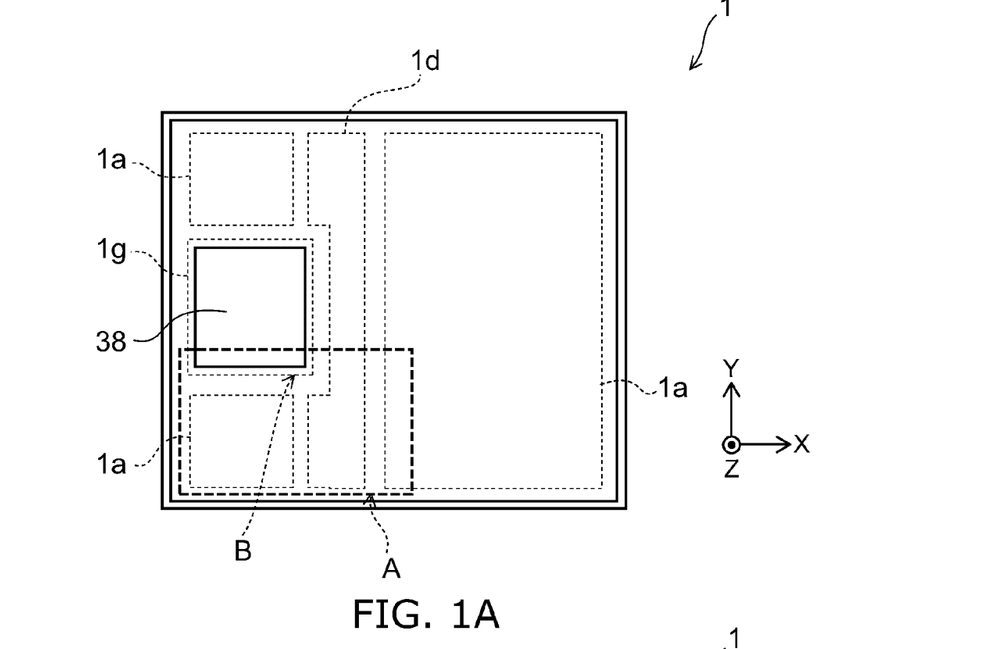
FIG. 1A is a schematic plan view showing a semiconductor device according to a first embodiment.
Figure 1B:
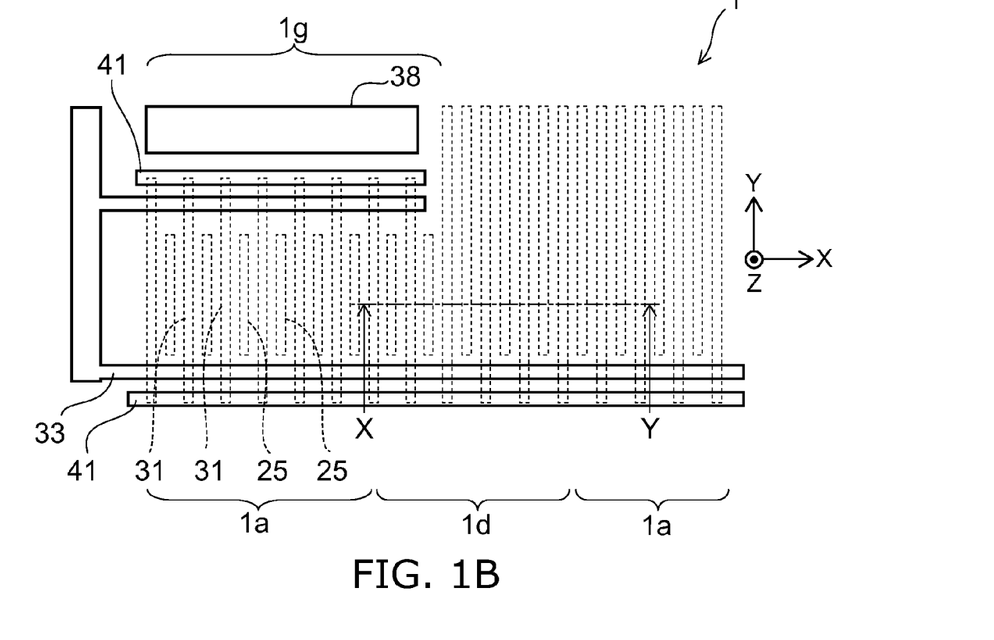
FIG. 1B is a schematic plan view showing the region indicated by arrow A of FIG. 1A.

FIG. 1A is a schematic plan view showing a semiconductor device according to a first embodiment. FIG. 1B is a schematic plan view showing the region indicated by arrow A of FIG. 1A.

The semiconductor device 1 according to the first embodiment is a power MOSFET. The semiconductor device 1 includes an active region 1a (first region), a gate pad region 1g (second region), and an unused region (inactive region) 1d (third region). For instance, the gate pad region 1g is juxtaposed with the active region 1a. For instance, the unused region 1d is juxtaposed with the active region 1a and the gate pad region 1g, and provided between the active region 1a and the gate pad region 1g. Part of the unused region 1d is slightly projected to the side of the active region 1a juxtaposed with the gate pad region 1g. That is, the unused region 1d is located near the corner of the gate pad region 1g.

In the active region 1a, active elements such as transistors or passive elements such as built-in diodes (parasitic diodes) are placed. In the gate pad region 1g, a pad electrode 38 is placed. The pad electrode 38 is provided above the drift layer described later. The pad electrode 38 is electrically connected to the gate electrode (gate electrode 30 described later) of the MOSFET. In the unused region 1d, no active element is placed.

In the semiconductor device 1, the active region 1a is divided by the unused region 1d. This is because of e.g. the following reason. For instance, electric field may locally concentrate on the corner of the pad electrode 38 indicated by arrow B. If the unused region 1d is not provided, the active region 1a is placed also near the corner of the pad electrode 38. In this placement, the active region 1a near the corner of the pad electrode 38 is affected by the local electric field at the pad electrode corner. Then, the element may fail to operate normally. To avoid this, in the semiconductor device 1, the unused region 1*d* is placed near the corner of the pad electrode 38.

Furthermore, FIG. 1B illustrates a gate wiring 33 and a source wiring 41. The gate wiring 33 is electrically connected to the pad electrode 38 and the gate electrode. The source wiring 41 is electrically connected to the source region described later.

Figure 2:
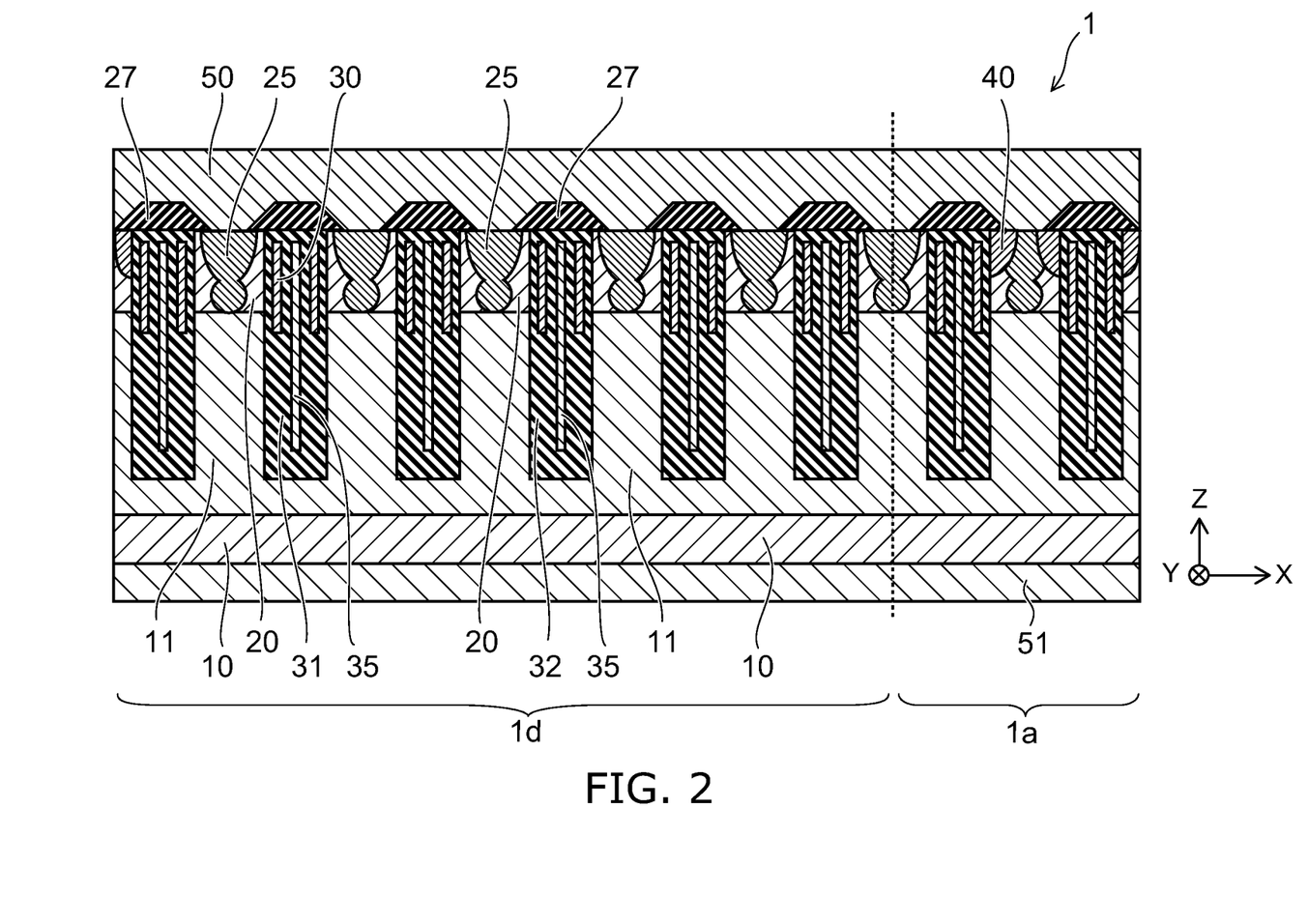
FIG. 2 is a schematic sectional view showing the semiconductor device according to the first embodiment.

FIG. 2 is a schematic sectional view showing the semiconductor device according to the first embodiment.

FIG. 2 shows a cross section at a position along line X-Y of FIG. 1B.

First, the structure of the active region 1*a* is described.

In the active region 1*a*, a plurality of MOSFETs are provided. The MOSFET is a MOSFET having what is called a vertical electrode structure.

For instance, in the active region 1*a*, on an n$^+$-type drain layer 10, an n$^-$-type drift layer 11 (first semiconductor layer) is provided. On the drift layer 11, a p-type base region 20 (first semiconductor region) is provided. On the base region 20, an n$^+$-type source region 40 (second semiconductor region) is provided. Furthermore, a p$^+$-type hole ejection region 25 (third semiconductor region) is juxtaposed with the source region 40. The hole ejection region 25 is in contact with the base region 20. The concentration of the impurity element contained in the hole ejection region 25 is higher than the concentration of the impurity element contained in the base region 20. The bottom of the hole ejection region 25 may be located above the junction between the drift layer 11 and the base region 20, or may be located below this junction.

A source electrode (first electrode) 50 is electrically connected to the source region 40 and the hole ejection region 25. A drain electrode 51 (second electrode) is in contact with the drain layer 10. The drift layer 11 is electrically connected to the drain electrode 51.

Furthermore, a gate electrode 30 (third electrode) extends from the position of the source region 40 to the position of the drift layer 11. The gate electrode 30 reaches the drift layer 11. An insulating film 31 is provided between the source region 40, the base region 20, and the drift layer 11 on one hand and the gate electrode 30 on the other. The insulating film 31 provided between the source region 40, the base region 20, and the drift layer 11 on one hand and the gate electrode 30 on the other may also be referred to as gate insulating film. The gate insulating film extends e.g. from the surface of the base region 20 into the drift layer 11. The gate electrode 30 is in contact with the drift layer 11 via the gate insulating film.

The direction from the source electrode 50 toward the drain electrode 51 is referred to as Z direction (first direction). A direction crossing the Z direction is referred to as X direction (second direction). In the active region 1*a*, a field plate electrode 35 (fourth electrode) is juxtaposed with the gate electrode 30 in the X direction. The field plate electrode 35 is electrically connected to the source electrode 50, or placed at a floating potential.

The field plate electrode 35 is in contact with the drift layer 11 via the insulating film 31. The insulating film 31 is provided also between the field plate electrode 35 and the gate electrode 30. The insulating film 31 in contact with the field plate electrode 35 may also be referred to as field plate insulating film. That is, the field plate electrode 35 is in contact with the drift layer 11 and the gate electrode 30 via the field plate insulating film. The thickness of the insulating film 31 in contact with the field plate electrode 35 is thicker than the thickness of the insulating film 31 in contact with the gate electrode 30. An interlayer insulating film 27 is provided between the source electrode 50 on one hand and the gate electrode 30 and the field plate electrode 35 on the other. The structure of the unused region 1*d* is now described.

In the unused region 1*d*, on the drain layer 10, a drift layer 11 is provided. On the drift layer 11, a base region 20 is provided. A hole ejection region 25 is in contact with the base region 20. In the unused region 1*d*, the bottom of the hole ejection region 25 may be located above the junction between the drift layer 11 and the base region 20, or may be located below this junction.

A source electrode 50 is electrically connected to the hole ejection region 25. A drain electrode 51 is in contact with the drain layer 10. The drift layer 11 is electrically connected to the drain electrode 51. Furthermore, in the unused region 1*d*, an insulating layer 32 (first insulating layer) is provided from the position of the hole ejection region 25 to the position of the drift layer 11. The depth of the insulating layer 32 is equal to the depth of the insulating film 31. In other words, the bottom of the insulating layer 32 is located at the same position as the bottom of the insulating film 31. The pitch in the X direction of a plurality of insulating layers 32 may be equal to or different from the pitch in the X direction of a plurality of insulating films 31.

As an example, FIG. 2 shows a configuration in which the insulating layer 32 surrounds the lower end and the side portion of the field plate electrode 35. Furthermore, on both sides of the field plate electrode 35, a pair of gate electrodes 30 are provided.

The cross-sectional structure in the X-Z plane of the insulating layer 32, the gate electrode 30, and the field plate electrode 35 in the unused region 1*d* is the same as the cross-sectional structure in the X-Z plane of the insulating film 31, the gate electrode 30, and the field plate electrode 35 in the active region 1*a*. This is because the insulating layer 32, the gate electrode 30, and the field plate electrode 35 in the unused region 1*d* is formed in the same manufacturing process as the insulating film 31, the gate electrode 30, and the field plate electrode 35 in the active region 1*a*. In the unused region 1*d*, the field plate electrode 35 and the gate electrode 30 may be removed appropriately.

An interlayer insulating film 27 is provided between the insulating layer 32 and the source electrode 50. The field plate electrode 35 surrounded with the insulating layer 32 is electrically connected to the source electrode 50, or placed at a floating potential. The gate electrode 30 in the unused region 1*d* is e.g. electrically connected to the source electrode 50 or the pad electrode 38, or placed at a floating potential.

The base region 20, the source region 40, the hole ejection region 25, the field plate electrode 35, the insulating film 31, and the insulating layer 32 each extend in the Y direction. The length in the Y direction of each of the base region 20, the source region 40, the hole ejection region 25, and the field plate electrode 35 is different between in the active region 1*a* and in the unused region 1*d*. The insulating layer 32 may be shaped like a mesh or ring instead of a stripe extending in the Y direction.

The material of the drain layer 10, the drift layer 11, the base region 20, the source region 40, and the hole ejection region 25 is e.g. silicon (Si), silicon carbide (SiC), or gallium arsenide (GaAs). The material of the source electrode 50, the drain electrode 51, and the pad electrode 38 can be e.g. at least one metal of aluminum (Al), nickel (Ni), copper (Cu), and titanium (Ti). The material of the gate electrode 30 and the field plate electrode 35 includes e.g. polysilicon or tungsten (W). The material of the source wiring 41 and the gate wiring 33 includes e.g. polysilicon or at least one metal of aluminum (Al), nickel (Ni), copper (Cu), and titanium (Ti). The insulating film and the insulating layer according to the embodiment include e.g. silicon dioxide ($SiO_x$) or silicon nitride ($SiN_x$).

The insulating film 31 and the insulating layer 32 are formed in a trench formed in the drift layer 11. Thus, the insulating film 31 and the insulating layer 32 may be referred to as a trench structure. Furthermore, the gate electrode 30 may be referred to as trench gate. Thus, the MOSFET provided in the semiconductor device 1 may be referred to as a trench gate MOSFET having a field plate structure.

In FIG. 2, the MOSFET having a vertical electrode structure is shown. However, the embodiment also includes an IGBT (insulated gate bipolar transistor) in which a $p^+$-type semiconductor layer is provided between the drain electrode 51 and the drain layer 10. In the embodiment, $n^+$-type, n-type, and $n^-$-type may be referred to as first conductivity type, and $p^+$-type, p-type, and $p^-$-type may be referred to as second conductivity type. This notation means that the impurity concentration is decreased in the order of $n^+$-type, n-type, and $n^-$-type, and in the order of $p^+$-type, p-type, and $p^-$-type. Here, the "impurity concentration" refers to the effective concentration of the impurity element contributing to the conductivity of the semiconductor material. For instance, in the case where the semiconductor material contains an impurity element serving as a donor and an impurity element serving as an acceptor, the impurity concentration is defined as the concentration of activated impurity elements except the donor and the acceptor canceling each other.

The $n^+$-type, n-type, and $n^-$-type impurity element can be e.g. phosphorus (P) or arsenic (As). The $p^+$-type, p-type, and $p^-$-type impurity element can be e.g. boron (B).

Before describing the function of the semiconductor device 1, the function of a semiconductor device according to a reference example is described.

Figure 3A:
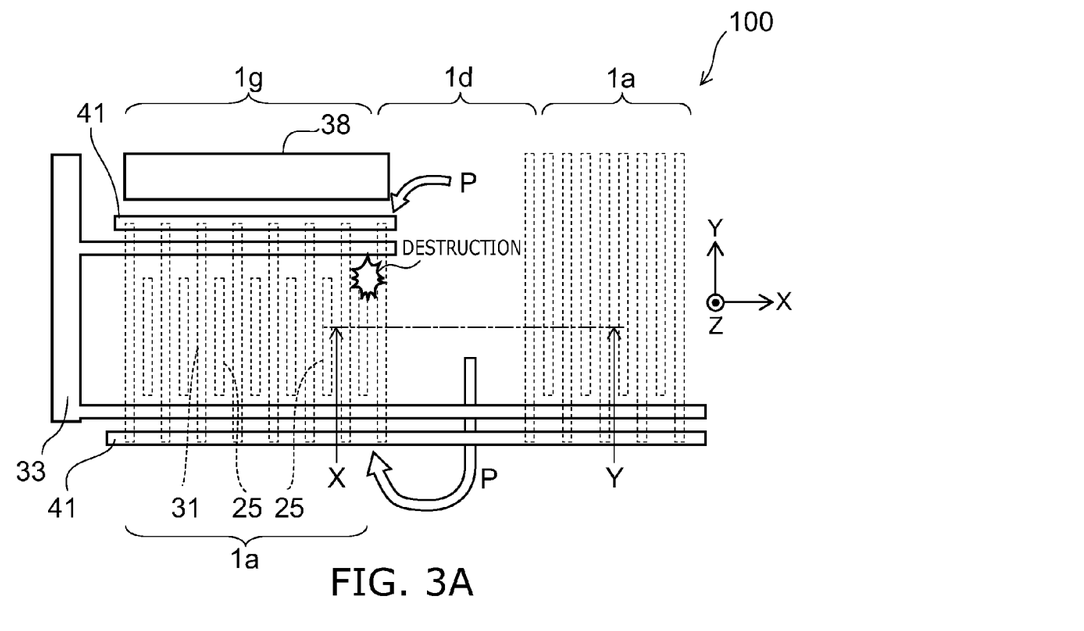
FIG. 3A is a schematic plan view showing the function of the semiconductor device according to the reference example.
Figure 3B:
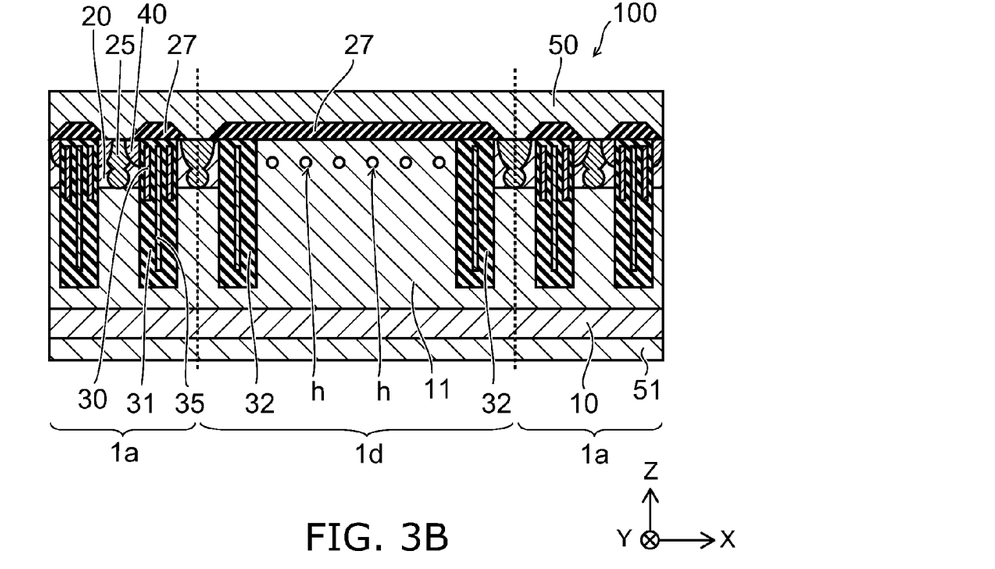
FIG. 3B is a schematic sectional view at a position along line X-Y of FIG. 3A.

FIG. 3A is a schematic plan view showing the function of the semiconductor device according to the reference example. FIG. 3B is a schematic sectional view at a position along line X-Y of FIG. 3A.

In the semiconductor device 100 according to the reference example, the aforementioned hole ejection region 25 is not provided in the unused region 1d. Furthermore, in the unused region 1d, although the trench structure exists on both sides thereof, the trench structure is not provided elsewhere. In the semiconductor device 100, the unused region 1d is an omitted portion of the trench structure.

In such a structure, when the parasitic diode is turned on, holes injected from the parasitic diode are easily accumulated in the unused region 1d. The parasitic diode is e.g. a pn junction diode made of the hole ejection region 25 and the drift layer 11. For instance, in FIG. 3B, holes accumulated in the drift layer 11 of the unused region 1d are schematically denoted by the symbol "h". Furthermore, in the semiconductor device 100, the portion below the pad electrode 38 has the same structure as the omitted portion of the trench structure. Thus, holes h are easily accumulated also below the pad electrode 38. Furthermore, holes h may be accumulated in the outer edge portion of the semiconductor device 1 except the active region, except the unused region, and except the gate pad region.

Next, when the parasitic diode is turned off (at reverse recovery time, recovery time), for instance, the accumulated holes h reach the hole ejection region 25 of the active region 1a through the drift layer 11. For instance, as indicated by arrow P of FIG. 3A, the accumulated holes h flow into the hole ejection region 25 close to the unused region 1d. Then, the holes h concentrate near the corner of the pad electrode 38 where electric field concentrates. When the semiconductor is not sufficiently tolerant to this locally concentrating hole current, the semiconductor device 100 is eventually destroyed. Thus, the semiconductor device 100 may fail to achieve high trr withstand capability.

In comparison, the function of the semiconductor device 1 is described.

Figure 4A:
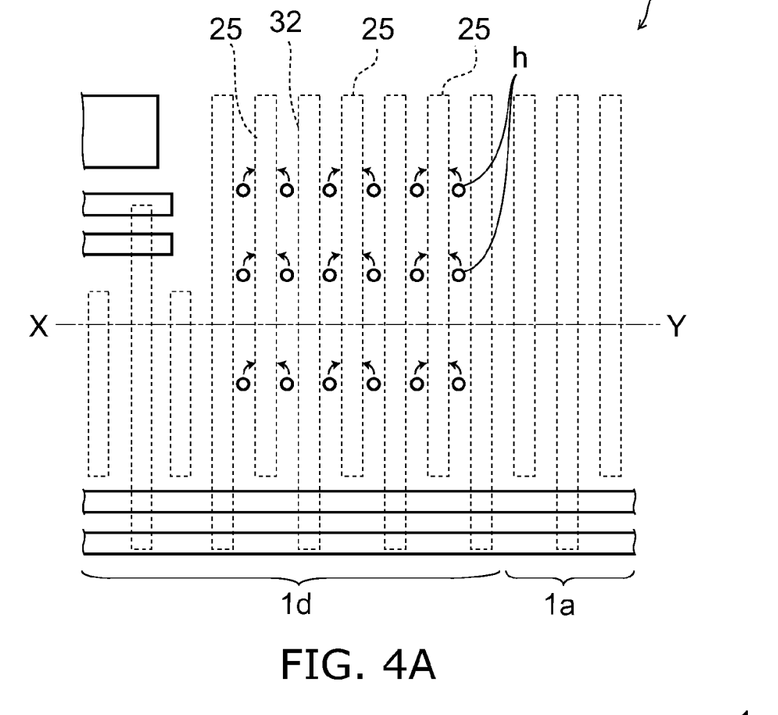
FIG. 4A is a schematic plan view showing the function of the semiconductor device according to the first embodiment.
Figure 4B:
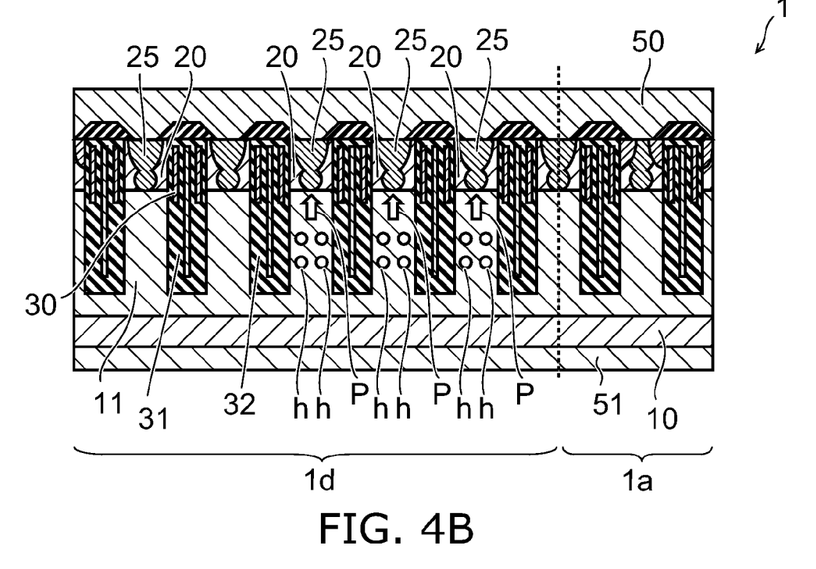
FIG. 4B is a schematic sectional view at a position along line X-Y of FIG. 4A.

FIG. 4A is a schematic plan view showing the function of the semiconductor device according to the first embodiment. FIG. 4B is a schematic sectional view at a position along line X-Y of FIG. 4A.

In the semiconductor device 1 according to the first embodiment, a plurality of hole ejection regions 25 are provided in the unused region 1d. Furthermore, the unused region 1d includes a trench structure. The unused region 1d is not an omitted portion as in the reference example.

At ON time of the MOSFET, holes injected from the parasitic diode may be accumulated in the unused region 1d. However, at OFF time (recovery time) of the MOSFET, as indicated by arrow P of FIG. 4A, the accumulated holes h flow out to the source electrode 50 through the hole ejection region 25 provided in the unused region 1d. Furthermore, in the semiconductor device 1, the trench structure is placed in the unused region 1d. Thus, in the unused region 1d of the semiconductor device 1, the hole accumulation region is smaller than in the unused region 1d of the semiconductor device 100.

Accordingly, in the semiconductor device 1, holes h do not easily concentrate near the corner of the pad electrode 38. Thus, in the semiconductor device 1, local concentration of the hole current does not easily occur. Accordingly, the aforementioned destruction does not easily occur. Thus, in the semiconductor device 1, the hole current injected from the parasitic diode is efficiently extracted to the source electrode 50 at recovery time. As a result, the semiconductor device 1 has higher trr withstand capability.

Furthermore, the hole ejection region 25 and the trench structure can be formed in the unused region 1d by changing the layout of the mask pattern. That is, in forming the hole ejection region 25 and the trench structure in the unused region 1d, there is no need to increase the manufacturing step. Thus, no cost increase is incurred.

(Second Embodiment)

Figure 5A:
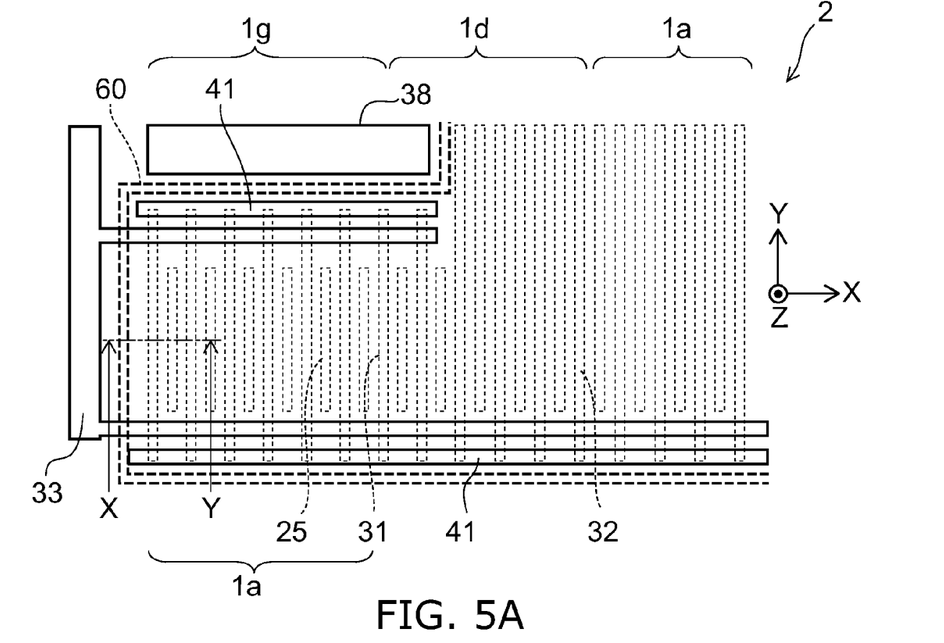
FIG. 5A is a schematic plan view showing a semiconductor device according to a second embodiment.
Figure 5B:
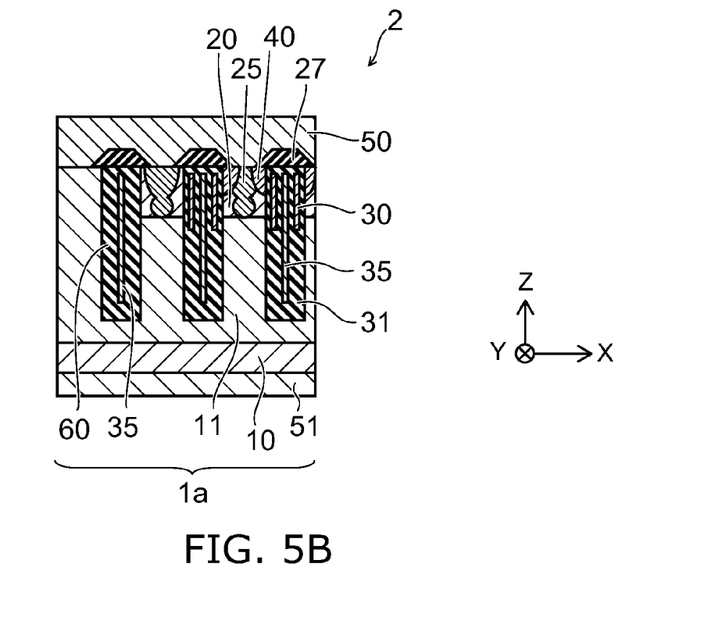
FIG. 5B is a schematic sectional view at a position along line X-Y of FIG. 5A.

FIG. 5A is a schematic plan view showing a semiconductor device according to a second embodiment. FIG. 5B is a schematic sectional view at a position along line X-Y of FIG. 5A.

The semiconductor device 2 according to the second embodiment further includes an insulating layer 60 (second insulating layer) in addition to the structure of the semiconductor device 1. The insulating layer 60 extends from the source electrode 50 side to the drift layer 11 side. The insulating layer 60 extends from the source electrode 50 to the drift layer 11. The insulating layer 60 may be referred to as dummy trench. The insulating layer 60 is provided outside the active region 1a and the unused region 1d. In the semiconductor device 2, the active region 1a and the unused region 1d are surrounded with the insulating layer 60. The depth of the insulating layer 60 is equal to the depth of the insulating film 31 or the depth of the insulating layer 32. Alternatively, a similar effect is achieved even if these depths are not equal as long as being a desired depth not affecting the characteristics.

FIG. 5B shows a configuration in which the insulating layer 60 surrounds the lower end and the side portion of the field plate electrode 35. The field plate electrode 35 surrounded with the insulating layer 60 is electrically connected to the source electrode 50, or placed at a floating potential. This field plate electrode 35 may be removed appropriately.

Thus, in the semiconductor device 2, the injection of the hole current from below the pad electrode 38 or the outer edge portion of the semiconductor device 2 into the active region 1a is further suppressed by the barrier of the insulating layer 60. As a result, the semiconductor device 2 has higher trr withstand capability than the semiconductor device 1.

(Third Embodiment)

Figure 6:
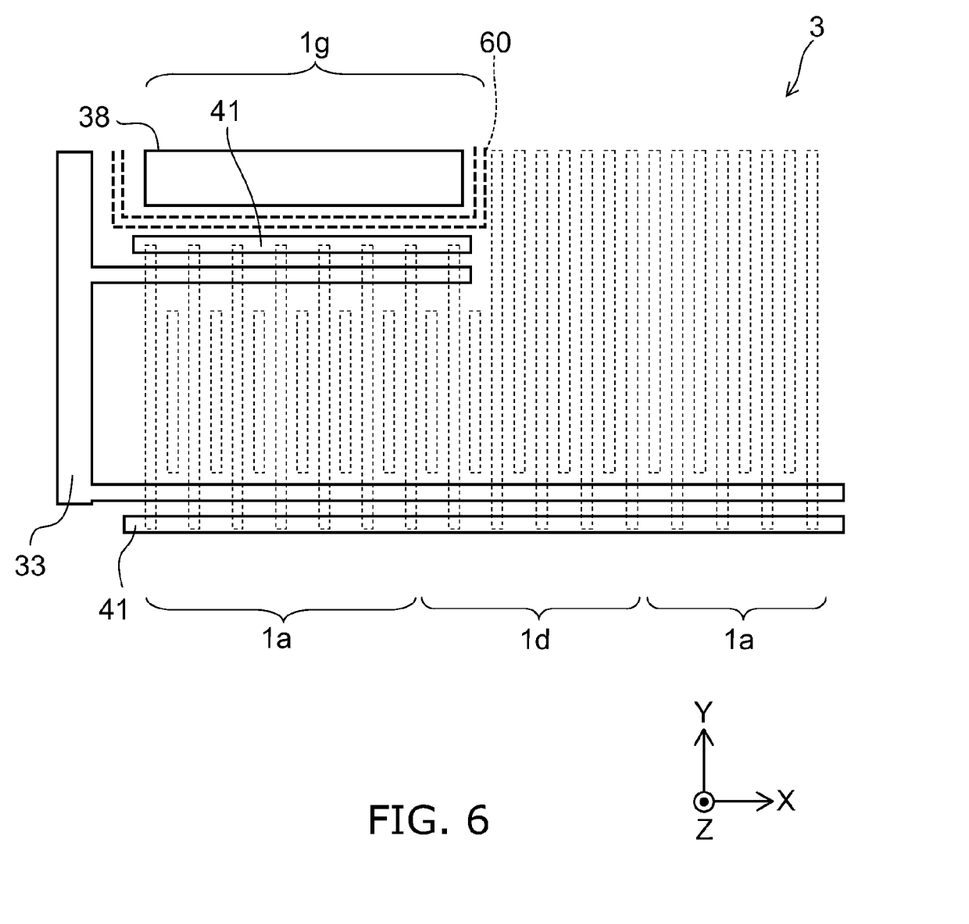
FIG. 6 is a schematic plan view showing a semiconductor device according to a third embodiment.

The insulating layer 60 may surround the region other than the active region and the unused region.

FIG. 6 is a schematic plan view showing a semiconductor device according to a third embodiment.

The semiconductor device 3 according to the third embodiment further includes an insulating layer 60 in addition to the structure of the semiconductor device 1. The cross-sectional structure of the insulating layer 60 provided in the semiconductor device 3 is the same as the cross-sectional structure of the insulating layer 60 provided in the semiconductor device 2. The insulating layer 60 provided in the semiconductor device 3 is referred to as third insulating layer. The insulating layer 60 may surround the lower end and the side portion of the field plate electrode 35. In this case, the field plate electrode 35 is electrically connected to the source electrode 50, or placed at a floating potential. This field plate electrode 35 may be removed appropriately. The insulating layer 60 extends from the source electrode 50 side to the drift layer 11 side. The insulating layer 60 is provided outside the gate pad region 1g. In the semiconductor device 3, the gate pad region 1g is surrounded with the insulating layer 60.

Thus, in the semiconductor device 3, the injection of the hole current from below the pad electrode 38 into the active region 1a is further suppressed by the barrier of the insulating layer 60. As a result, the semiconductor device 3 has higher trr withstand capability than the semiconductor device 1.

(Fourth Embodiment)

Figure 7A:
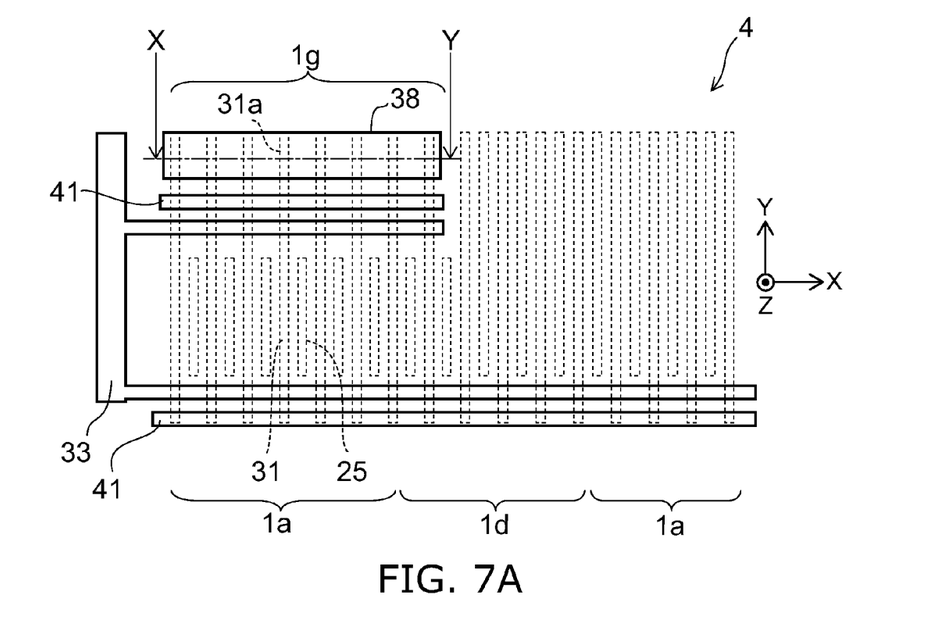
FIG. 7A is a schematic plan view showing a semiconductor device according to a fourth embodiment.
Figure 7B:
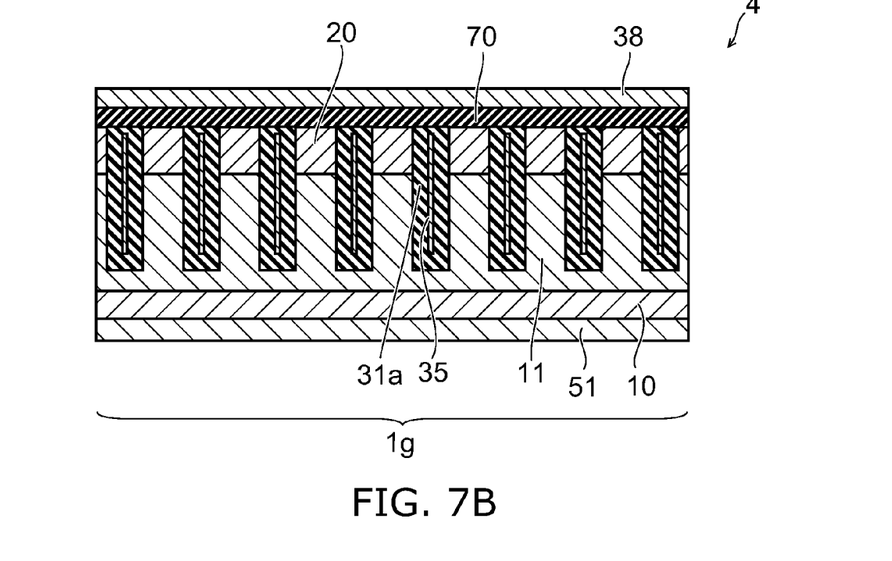
FIG. 7B is a schematic sectional view at a position along line X-Y of FIG. 7A.

FIG. 7A is a schematic plan view showing a semiconductor device according to a fourth embodiment. FIG. 7B is a schematic sectional view at a position along line X-Y of FIG. 7A.

The semiconductor device 4 according to the fourth embodiment further includes an insulating layer 31a in the gate pad region 1g in addition to the structure of the semiconductor device 1. An interlayer insulating film 70 is provided between the pad electrode 38 and the semiconductor. The insulating layer 31a provided below the pad electrode 38 is referred to as fourth insulating layer. In the semiconductor device 4, the drift layer 11 below the gate pad region 1g is divided into a plurality by the insulating layers 31a. That is, below the gate pad region 1g, a plurality of insulating layers 31a extend from the surface of the drift layer 11 into the drift layer 11. In the semiconductor device 4, the insulating film 31 placed in the active region 1a extends to the gate pad region 1g. This extended portion is referred to as insulating layer 31a. However, in the insulating layer 31a, the gate electrode 30 is not provided.

The insulating layer 31a may surround the lower end and the side portion of the field plate electrode 35. In this case, the field plate electrode 35 is electrically connected to the source electrode 50, or placed at a floating potential. This field plate electrode 35 may be removed appropriately. Furthermore, the insulating film 31 placed in the active region 1a does not need to be extended to the gate pad region 1g, but there may be a discontinuity between the insulating film 31 and the insulating layer 31a. The pitch in the X direction of a plurality of insulating layers 31a may be equal to or different from the pitch in the X direction of a plurality of insulating films 31.

In such a structure, the hole accumulation region of the drift layer 11 of the gate pad region 1g is reduced because of the presence of a plurality of insulating layer 31a. The reduction of the hole accumulation region of the drift layer 11 results in decreasing the density of holes h accumulated below the pad electrode 38. Thus, in the semiconductor device 4, the injection of the hole current from below the pad electrode 38 into the active region 1a is further suppressed. As a result, the semiconductor device 4 has higher trr withstand capability than the semiconductor device 1.

In FIG. 7B, the base region 20 is shown. However, below the pad electrode 38, the base region 20 may be removed. In this case, the portion of the base region 20 in FIG. 7B is occupied by the drift layer 11. Also in this case, the same effect is achieved.

(Fifth Embodiment)

Figure 8:
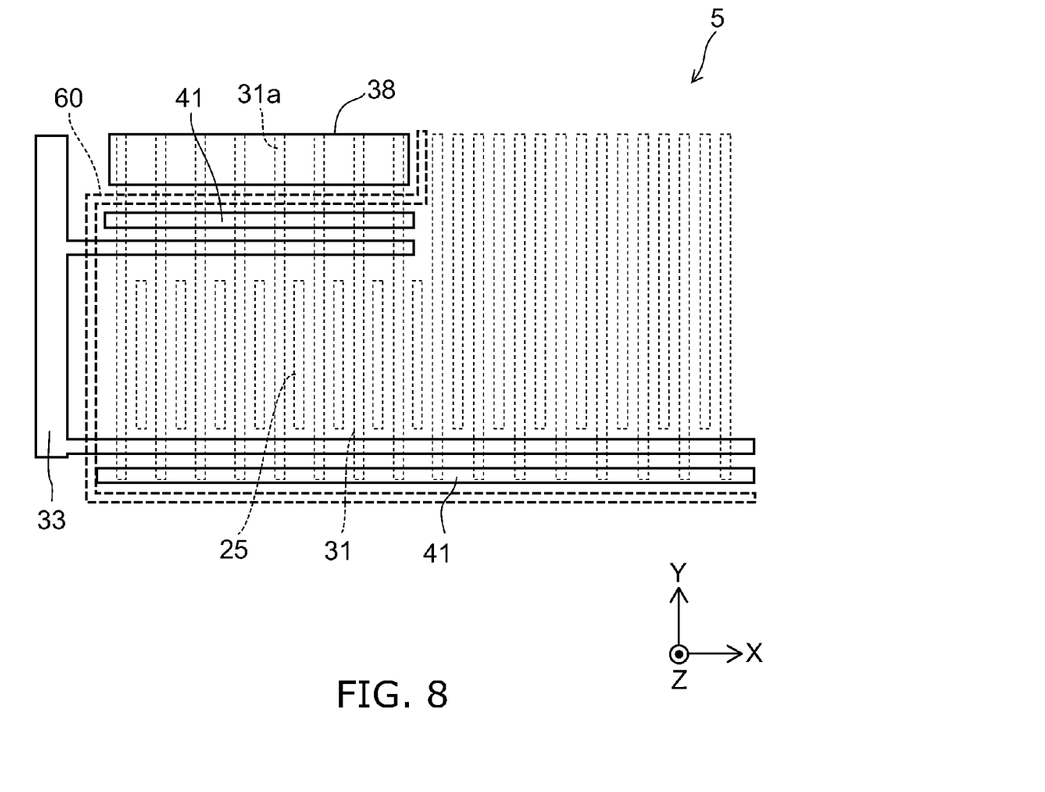
FIG. 8 is a schematic plan view showing a semiconductor device according to a fifth embodiment.

FIG. 8 is a schematic plan view showing a semiconductor device according to a fifth embodiment.

The semiconductor device 5 according to the fifth embodiment has a composite structure of the semiconductor device 2 and the semiconductor device 4. In such a structure, the injection of the hole current from below the pad electrode 38 or the outer edge portion of the semiconductor device 5 into the active region 1a is suppressed by the barrier of the insulating layer 60. Furthermore, the density of holes h accumulated below the pad electrode 38 is decreased. Consequently, the injection of the hole current from below the pad electrode 38 into the active region 1a is further suppressed. As a result, the semiconductor device 5 has higher trr withstand capability than the semiconductor devices 1, 2, and 4.

(Sixth Embodiment)

Figure 9:
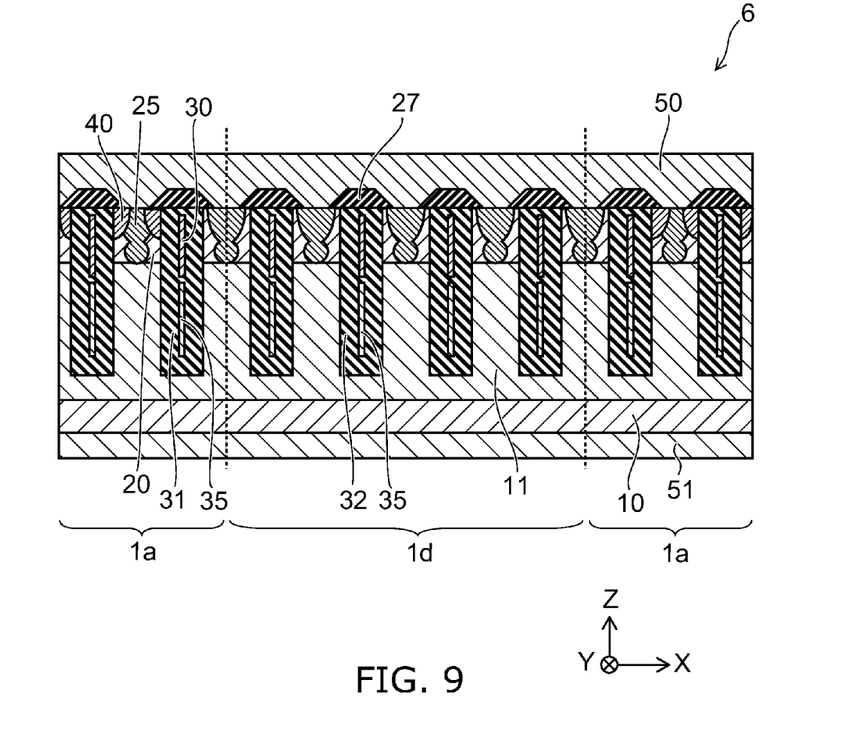
FIG. 9 is a schematic plan view showing a semiconductor device according to a sixth embodiment.

FIG. 9 is a schematic plan view showing a semiconductor device according to a sixth embodiment.

In the semiconductor device 6 according to the sixth embodiment, in the active region 1a, the field plate electrode 35 is juxtaposed with the gate electrode 30 in the Z direction from the source electrode 50 toward the drain electrode 51. That is, the field plate electrode 35 is located below the gate electrode 30. Such a structure also exhibits the same function as the semiconductor device 1.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

The term "on" in "a portion A is provided on a portion B" refers to the case where the portion A is provided on the portion B such that the portion A is in contact with the portion B and the case where the portion A is provided above the portion B such that the portion A is not in contact with the portion B.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first region;
a second region; and
a third region provided between the first region and the second region,
the first region including:
a first semiconductor layer of a first conductivity type;
a first semiconductor region of a second conductivity type provided on the first semiconductor layer;
a second semiconductor region of the first conductivity type provided on the first semiconductor region;
a third semiconductor region of the second conductivity type being in contact with the first semiconductor region, and the third semiconductor region having higher impurity concentration than the first semiconductor region;
a first electrode electrically connected to the second semiconductor region and the third semiconductor region;
a second electrode electrically connected to the first semiconductor layer;
an insulating film extending from a surface of the first semiconductor region into the first semiconductor layer;
a third electrode in contact with the first semiconductor region via the insulating film;
a fourth electrode in contact with the first semiconductor layer and the third electrode via the insulating film,
the second region including a pad electrode electrically connected to the third electrode above the first semiconductor layer, and
the third region including:
the first semiconductor layer;
the first semiconductor region provided on the first semiconductor layer;
the third semiconductor region in contact with the first semiconductor region;
the first electrode electrically connected to the third semiconductor region;
the second electrode electrically connected to the first semiconductor layer; and
a first insulating layer extending from a position of the third semiconductor region to a position of the first semiconductor layer.

2. The device according to claim 1, wherein the third region is provided between the first regions.

3. The device according to claim 1, wherein depth of the first insulating layer of the third region is equal to depth of the insulating film of the first region.

4. The device according to claim 1, wherein pitch of a plurality of the first insulating layers arranged in the third region is equal to pitch of a plurality of the insulating films arranged in the first region.

5. The device according to claim 1, wherein pitch of a plurality of the first insulating layers arranged in the third region is different from pitch of a plurality of the insulating films arranged in the first region.

6. The device according to claim 1, wherein
the third region further includes the fourth electrode surrounded with the first insulating layer, and
the fourth electrode is electrically connected to the first electrode, or a potential of the fourth electrode is a floating potential.

7. The device according to claim 1, wherein
the third region further includes the third electrode surrounded with the first insulating layer and the third electrode is juxtaposed with the fourth electrode, and
the third electrode is electrically connected to the first electrode or the pad electrode, or a potential of the third electrode is a floating potential.

8. The device according to claim 1, wherein the insulating film and the first insulating layer extend in a same direction.

9. The device according to claim 1, wherein the insulating film and the first insulating layer are different in extending length.

10. The device according to claim 1, further comprising:
a second insulating layer extending from the first electrode to the first semiconductor layer,
wherein the first region and the third region are surrounded with the second insulating layer.

11. The device according to claim 10, wherein depth of the second insulating layer is equal to depth of the insulating film or depth of the first insulating layer.

12. The device according to claim 10, further comprising:
the fourth electrode surrounded with the second insulating layer,
wherein the fourth electrode is electrically connected to the first electrode, or a potential of the fourth electrode is a floating potential.

13. The device according to claim 1, further comprising:
a third insulating layer extending from the first electrode side to the first semiconductor layer side,
wherein the second region is surrounded with the third insulating layer.

14. The device according to claim 1, wherein the second region further includes a plurality of fourth insulating layers extending from a surface of the first semiconductor layer into the first semiconductor layer below the pad electrode.

15. The device according to claim 1, wherein the fourth electrode is juxtaposed with the third electrode in a second direction crossing a first direction from the first electrode toward the second electrode.

* * * * *